(12) United States Patent
Tsuchiya et al.

(10) Patent No.: US 7,771,531 B2
(45) Date of Patent: Aug. 10, 2010

(54) MANUFACTURING METHOD AND USAGE OF CRYSTALLIZED METAL OXIDE THIN FILM

(75) Inventors: Tetsuo Tsuchiya, Ibaraki (JP); Tomohiko Nakajima, Ibaraki (JP); Akio Watanabe, Ibaraki (JP); Toshiya Kumagai, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 11/836,387

(22) Filed: Aug. 9, 2007

(65) Prior Publication Data

US 2008/0035898 A1 Feb. 14, 2008

(30) Foreign Application Priority Data

Aug. 11, 2006 (JP) ............................. 2006-219834

(51) Int. Cl.
- *C30B 11/00* (2006.01)
- *C30B 21/02* (2006.01)
- *C04B 35/64* (2006.01)

(52) U.S. Cl. ........................... 117/79; 117/70; 117/944; 117/68; 252/62.56

(58) Field of Classification Search ...................... 117/2, 117/3, 5, 7, 92, 95, 108, 68, 70, 944; 427/248.1; 252/62.56

See application file for complete search history.

(56) References Cited

U.S. PATENT DOCUMENTS

| 4,822,509 A | * | 4/1989 | Bishara et al. | ........... 252/62.56 |
| 5,039,654 A | * | 8/1991 | Mizuta et al. | ............... 505/233 |
| 5,071,830 A | * | 12/1991 | Olson et al. | ................. 505/446 |
| 5,494,700 A | * | 2/1996 | Anderson et al. | ........... 427/115 |
| 6,183,554 B1 | * | 2/2001 | Mizuta et al. | ................. 117/68 |
| 6,576,302 B1 | * | 6/2003 | Mizuta et al. | ............... 427/597 |
| 6,585,909 B2 | * | 7/2003 | Tsuchiya et al. | ............... 216/86 |
| 6,589,453 B1 | * | 7/2003 | Saitoh et al. | ................... 264/6 |
| 6,632,749 B2 | * | 10/2003 | Miyasaka et al. | ........... 438/788 |
| 6,797,338 B2 | * | 9/2004 | Saitoh et al. | ................ 427/561 |

(Continued)

FOREIGN PATENT DOCUMENTS

JP 2000-256862 A 9/2000

(Continued)

OTHER PUBLICATIONS

ESP@CENET Database, English Abstract of JP 2005-068352, Mar. 17, 2005.

(Continued)

*Primary Examiner*—G. Nagesh Rao
(74) *Attorney, Agent, or Firm*—Howson & Howson LLP

(57) ABSTRACT

Provided is a manufacturing method of a crystallized rare-earth thin films on a glass or a silicon substrate. This manufacturing method of a crystallized metal oxide thin film includes a step of retaining an metal organic thin film or a metal oxide film containing at least one type of rare-earth metal element selected from a group comprised of Y, Dy, Sm, Gd, Ho, Eu, Tm, Tb, Er, Ce, Pr, Yb, La, Nd and Lu formed on a substrate at a temperature of 250 to 600° C., and a step of crystallizing the organic metal thin film or the metal oxide film while irradiating ultraviolet radiation having a wavelength of 200 nm or less.

12 Claims, 3 Drawing Sheets

PL spectra of $Y_2O_3$:Eu films prepared by (a)ArF laser assisted metal organic deposition and (b)thermal treatment.
(a)ArF,1Hz, 100pulse with 500deg.
(b)500deg.,(c)750deg.,(d)900deg.

U.S. PATENT DOCUMENTS

| | | | |
|---|---|---|---|
| 7,208,203 B2 * | 4/2007 | Yamada et al. | 427/553 |
| 7,381,633 B2 * | 6/2008 | Thompson et al. | 438/608 |
| 7,606,448 B2 * | 10/2009 | Forbes et al. | 385/14 |
| 2005/0142742 A1 | 6/2005 | Tonomura et al. | |
| 2005/0285521 A1 * | 12/2005 | Menda | 313/512 |
| 2006/0166537 A1 * | 7/2006 | Thompson et al. | 439/189 |
| 2007/0126021 A1 * | 6/2007 | Ryu et al. | 257/103 |
| 2007/0178670 A1 * | 8/2007 | Sengupta et al. | 438/478 |
| 2007/0218203 A1 * | 9/2007 | Nishiguchi et al. | 427/255.6 |
| 2008/0035898 A1 * | 2/2008 | Tsuchiya et al. | 252/600 |
| 2008/0044590 A1 * | 2/2008 | Tsuchiya et al. | 427/553 |
| 2008/0044673 A1 * | 2/2008 | Miyamoto et al. | 428/469 |
| 2008/0073643 A1 * | 3/2008 | Ryu et al. | 257/43 |

FOREIGN PATENT DOCUMENTS

| | | | |
|---|---|---|---|
| JP | 2000264679 A * | 9/2000 | |
| JP | 2000-256862 | * 10/2000 | |
| JP | 2002-235078 A | 8/2002 | |
| JP | 2005-068352 A | 3/2005 | |

OTHER PUBLICATIONS

ESP@CENET Database, English Abstract of JP 2002-235078, Aug. 23, 2002.

ESP@CENET Database, English Abstract of JP 09-162088, Jun. 20, 1997.

ESP@CENET Database, English Abstract of JP 01-294506, Nov. 28, 1989.

ESP@CENET Database, English Abstract of JP 2000-256862, Sep. 19, 2000.

* cited by examiner

XRD patterns of films prepared by thermal treatment (a) Thermal treatment at 500deg after dried at 100deg.
(b) Thermal treatment at 750deg after heated at 400deg.

XRD patterns of $Y_2O_3$:Eu films prepared by ArF laser assisted metal organic deposition.

(a): ArF, substrate temperature ; 200 degree, (b): ArF, substrate temperature ; 400 degree, (c): ArF, substrate temperature ; 500 degree, (d): thermaly treatment at 500 deg.

PL spectra of $Y_2O_3$:Eu films prepared by (a)ArF laser assisted metal organic deposition and (b)thermal treatment.

(a)ArF,1Hz, 100pulse with 500deg.
(b)500deg.,(c)750deg.,(d)900deg.

MANUFACTURING METHOD AND USAGE OF CRYSTALLIZED METAL OXIDE THIN FILM

BACKGROUND

Materials using rare-earth elements are being used in various fields such as for medical supplies (X-ray films), permanent magnets, glass abrasives, glass coloring substances, ultrasmall lenses, phosphors, magnetic disks, lasers and the like, and are known as industrially important metal elements. Although materials containing rare-earth elements were conventionally used as bulk materials, pursuant to the development of advanced information society in recent years, these materials are now being used as thin films or layered films containing dissimilar materials for fabricating a new devices. For example, pursuant to the highly information-oriented society centering on the Internet, demands are increasing for flat panel displays (hereinafter referred to as "FPD") as represented by liquid crystal displays (hereinafter referred to as "LCD"), plasma displays (hereinafter referred to as "PDP"), field emission displays (hereinafter referred to as "FED"), and organic EL displays. Among them, the use of rare-earth oxide as the phosphor film of full-color FED and vacuum fluorescent display (VFD) is being considered. Further, in order to miniaturize and reduce the power consumption of semiconductor integrated circuits and semiconductor devices used in computers and mobile phones in which further technical advantages are expected, the necessity for making a gate insulation film a high dielectric constant insulation film (High-K insulation film) is increasing, and the use of rare-earth oxide films formed of $Y_2O_3$, $La_2O_3$, $CeO_2$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$ and the like as the gate insulation film is being considered. In addition, in order to create a high performance device using a metal oxide thin film, the manufacture of an epitaxial metal oxide thin film obtained by controlling the crystal orientation of the thin film is becoming essential, and rare-earth oxide is being used as an buffer layer for preparing epitaxial thin films from the perspective of crystal structure and chemical stability. For instance, when fabricating metal oxide such as a ferroelectric material or an infrared sensor material on a silicon substrate, a rare-earth oxide thin film formed from cerium oxide or the like can be used as the buffer layer in order to alleviate the lattice mismatch of the silicon substrate and the ferroelectric material and control the generation of an impurity phase. Like this, since the application of rare-earth metal oxide thin films is wide-ranging, these thin films are crucially important materials for the sustained development of a highly information-oriented society. Nevertheless, in all of the foregoing cases, since high-temperature heat treatment is required to prepare the thin films, reaction at the substrate and rare-earth oxide film interface and deterioration of the substrate caused major problems. The present invention relates to the manufacturing method and usage of a crystallized metal oxide thin film for use as a DRAM capacitor, a plasma-resistant thin film, a phosphor film, an epitaxial thin film, an infrared sensor device buffer layer, superconducting device buffer layer and a dielectric device buffer layer.

FED is a display device based on the fundamental principle of emitting electrons from a planate emitter into a vacuum, and colliding such electrons with phosphor to emit light. In this technology, a device corresponding to an electron gun of a cathode ray tube is formed in a planar shape, and a bright and high-contrast screen like a cathode ray tube (hereinafter referred to as "CRT") is realized in a large flat-panel display. With CRT, one electron gun that emits electrons is positioned a dozen to several ten centimeters away from the light-emitting surface. Meanwhile, with FED, electrodes in the form of minute protrusions are arranged on a glass substrate in a lattice pattern in an equal number as the number of pixels, and the respective electrodes discharge electrons toward the phosphors that are arranged to face each other in several millimeter intervals on the glass substrate. Since the deflection required in CRT is no longer necessary, it is possible to fabricate a large flat-screen display, and the power consumption can also be reduced to roughly half of a CRT display. FED is considered to be promising technology that will realize large flat-screen televisions/displays for the next generation along with LCD and PDP.

With conventional manufacturing methods of a phosphor film, after the preparation of particulates, screen printing was used to manufacture the phosphor film. In order to put full-color FED into practical use, various phosphors that are highly efficient and have minimal effect on the field emitter are essential, and this is the high-priority issue in realizing full-color FED. Heretofore, materials with high probability of being used as the FED phosphor were as follows. Red: [$SrTiO_3$:Pr, $Y_2O_3$:Eu], blue: [$Zn(Ga, Al)_2O_4$:Mn, $Y_3(Al, Ga)_5O_{12}$, ZnS:Cu,Al], blue: [$Y_2SiO_5$:Ce, $ZnGa_2O_4$, ZnS:Ag, Cl] and so on. While nonoxide phosphor is unstable to electron beams, oxide phosphor is stable and attracting attention as the FED phosphor.

Nevertheless, since conventional phosphor films were fabricated with a binder, there is a problem in that it is not possible to maintain high luminous efficiency due to the discharge of gas by electron beam irradiation. As one method of overcoming this problem, the possibility of improving characteristics by directly manufacturing a rare-earth phosphor film on a glass substrate is being considered.

As representative manufacturing methods of $Y_2O_3$ thin films, the following have been reported: electron beam evaporation (Applied Surface Science, 212-213 (2003) 815; "Non-Patent Document 1"), sputtering method (Japanese Patent Laid-Open Publication No. 2005-68352; "Patent Document 1"), sol-gel method (Japanese Patent Laid-Open Publication No. 2002-235078; "Patent Document 2"), and atomization thermal decomposition method (Journal of Luminescence, 93 (2001) 313; "Non-Patent Document 2").

Nevertheless, since all of the foregoing methods include the step of subjecting the substrate to heat treatment at a high temperature of 500° C. to 1000° C., it was difficult to form a thin film on an organic substrate or a glass substrates or a Si substrate.

Further, since a rare-earth oxide such as $Y_2O_3$ has a large dielectric constant, it can be used as a DRAM capacitor (Japanese Patent Laid-Open Publication No. 2005-150416; "Patent Document 3"). Normally, since silicon is used as the lower electrode, it is desirable to prepare the thin film at a low temperature that will not cause an oxidation reaction.

Similarly, it is also possible to use a rare-earth oxide film formed from $Y_2O_3$ or the like as a buffer layer on silicon or a single crystal substrate (Japanese Patent Laid-Open Publication No. 1997-162088; "Patent Document 4"). Patent Document 4 uses a $CeO_2$ (cerium oxide) tablet to prepare a $CeO_2$ epitaxial layer on a silicon substrate with the electron beam evaporation method at 800° C. Nevertheless, when there is a read circuit containing an organic material or an aluminum wiring, it is difficult to prepare the device since such read circuit will be broken. As described above, the application of rare-earth thin films is wide-ranging, and, since such thin film is a crucially important industrial material, preparation of new devices will be enabled by developing crystal growth technology at a low temperature of 500° C. or lower, As a method of preparing a certain type of metal oxide film, a manufacturing method of a metal oxide and a metal oxide thin film based on an excimer laser, comprising the steps of dissolving metal organic acid salt or an organic metal compound $M_mR_n$ (provided M=4b group elements of Si, Ge, Sn, Pb; 6a group elements of Cr, Mo, W; 7a group elements of Mn, Tc, Re; R=an alkyl group such as $CH_3$, $C_2H_5$, $C_3H_7$, $C_4H_9$; or a carboxyl group such as $CH_3COO^-$, $C_2H_5COO^-$, $C_3H_7COO^-$, $C_4H_9COO^-$; or a carbonyl group of CO; wherein m and n are integers) in a soluble solvent (or if a liquid, using it as is), dispersively applying such solution on a substrate, and subjecting the resultant substrate to irradiation with an excimer laser under an oxygen environment, is known. (Specification of Japanese Patent No. 2759125; "Patent Document 5").

In addition, there is a method of manufacturing a metal oxide on a substrate without heat treatment at a high temperature as performed in a conventional metalorganic deposition. For instance, a manufacturing method of a metal oxide for forming a metal oxide on a substrate, comprising the steps of dissolving a metal organic compound (metal organic acid salt, metal acetylacetonato, metal alkoxide including an organic group of carbon number 6 or greater) in a solvent to obtain a solution, applying such solution on a substrate, thereafter drying the substrate, and subjecting the resultant substrate to irradiation with a laser beam having a wavelength of 400 nm or less, is known. (Japanese Patent Laid-Open Publication No. 2001-31417; "Patent Document 6").

Patent Document 6 describes a manufacturing method of a metal oxide for forming a metal oxide on a substrate, comprising the steps of dissolving a metal organic compound in a solvent to obtain a solution, applying such solution on a substrate, thereafter drying the substrate, and subjecting the resultant substrate to irradiation with a laser beam having a wavelength of 400 nm or less; for instance, an excimer laser selected from ArF, KrF, XeCl, XeF and $F_2$, and further describes that the irradiation of the laser beam having a wavelength of 400 nm or less is performed in a plurality of stages, wherein the initial stage of irradiation is performed with weak irradiation that will not completely decompose the metal organic compound, and the subsequent stage of irradiation is performed with strong irradiation that will even change the oxide. Further, it is also known that the metal organic compound is a compound comprising two or more types of different metals, the obtained metal oxide is a compound metal oxide comprising different metals, and the metal of the metal organic acid salt is selected from a group comprised of iron, indium, tin, zirconium, cobalt, iron, nickel and lead.

Furthermore, a manufacturing method of a compound oxide film comprising the steps of applying and depositing a precursor coating solution containing a starting material component of the respective oxides of La, Mn and Ca, Sr or Ba on the substrate, thereafter the crystallized thin film was formed on the substrate, and forming a compound oxide film (that does not show superconductivity) having a perovskite structure as represented with the composition formula of $(La_{1-x}M_x)MnO_{3-\delta}$ (M:Ca, Sr, Ba, $0.09 \leq x \leq 0.50$), wherein after applying and depositing the precursor coating solution on the substrate, the thin film is crystallized by laser irradiation light having a wavelength of 360 nm or less on the thin film formed on the substrate.(Japanese Patent Laid-Open Publication No. 2000-256862; "Patent Document 7").

Here, as the irradiating light source, ArF excimer laser, KrF excimer laser, XeCl excimer laser, XeF excimer laser, third harmonic generation of YAG laser, or fourth harmonic generation of YAG laser is used for the preparation of the oxide thin film, and the precursor coating solution to be applied on the substrate is obtained by mixing, reacting and adjusting an alkanolamine coordinate compound of La, carboxylate of Mn, and metal or alkoxide of M in a primary alcohol in which the carbon number is 1 to 4.

SUMMARY

In the conventional manufacturing methods of a phosphor film containing a rare-earth element as represented by $Y_2O_3$, since high temperature heat treatment was required when subjecting the metal organic compound to thermal decomposition or forming a phosphor film, it was difficult to form a thin film on a glass substrate. Moreover, although Patent Document 5, Patent Document 6 and Patent Document 7 describe that an ultraviolet laser is effective for forming certain types of metal oxide thin films at a low temperature, there is no description concerning rare-earth oxides. In addition, although all of the Patent Documents mention that any type of ultraviolet laser is effective, it has been discovered that lasers of 248 nm, 266 nm, 308 nm, 351 nm and so on do not cause any crystal growth of the rare-earth oxide thin film on glass when the film was irradiated. The present invention discovered that the use of a laser that is 200 nm or less causes crystal growth in a rare-earth oxide thin film. Thus, an object of this invention is to provide a manufacturing method of a well crystallized rare-earth oxide thin film on a glass or a silicon substrate.

In order to achieve the foregoing object, the present invention substitutes a part of the heat treatment process in a metalorganic deposition (MOD) process with irradiation of ultraviolet radiation (laser) during the manufacture of a rare-earth metal oxide thin film. In other words, when manufacturing a crystallized rare-earth metal oxide thin film through process (1) of applying and drying a metal organic compound solution on a support, process (2) of subjecting an organic constituent to thermal decomposition calcination, and process (3) of baking for converting the resultant into a phosphor film, the present invention provides a manufacturing method of a crystallized rare-earth metal oxide thin film as represented by a $Y_2O_3$ thin film in which ultraviolet radiation (laser), particularly having a wavelength of 200 nm or less, is irradiated in parallel with process (2) and process (3), or before process (2). Thereby, low-temperature and high-speed deposition of the phosphor film material (considerable shortening of the thermal treatment time) is enabled, and, by precisely controlling the use of masks and irradiation position of the ultraviolet radiation, patterning required for the device can be conducted simultaneously with the deposition.

In other words, the present invention offers a manufacturing method of a phosphor film including the step of irradiating ultraviolet radiation on an organic thin film and an inorganic film when crystallizing a metal oxide thin film in which an oxide is forming the phosphor thin film. Incidentally, as the manufacturing method of an organic film or an inorganic film of a precursor, other physical methods (sputtering, MBE, laser abrasion) or chemical methods (spray pyrolysis, CVD) may also be used.

Further, as the metal for the oxide to form a phosphor substance, a substance base material containing at least one type of element among the rare-earth elements of Y, Dy, Sm, Gd, Ho, Eu, Tm, Tb, Er, Ce Pr, Yb, La, Nd and Lu, and a precursor film added with at least one type selected from Ce, Pr, Nd, Sm, Eu, Gd, Tb, Dy, Ho, Er, Tm, Yb and Lu as the emission center may be used.

The present invention is also effective for a thin film containing at least one or more types of conductive substances selected from $In_2O_3$, $SnO_2$, ZnO and metal in advance.

In the present invention, as the support, one type selected from organic substrate, glass substrate, strontium titanate ($SrTiO_3$), lanthanum aluminate ($LaAlO_3$), magnesium oxide (MgO), lanthanum strontium tantalum aluminum oxide (($La_xSr_{1-x}$)($Al_xTa_{1-x}$)$O_3$), neodymium gallate ($NdGaO_3$), yttrium aluminate ($YAlO_3$) single crystal, aluminum oxide ($Al_2O_3$), and yttria-stabilized zirconia (YSZ) substrate may be used.

Moreover, in the present invention, it is preferable that a metal organic compound of the organic metal thin film is one type selected from β-diketonato, long-chain alkoxide with carbon number 6 or greater, and organic acid salt that may contain halogen. In addition, a laser and/or lamp light may be used as the ultraviolet radiation in this invention.

The present invention yields a significant effect of forming a phosphor film on a glass substrate or a silicon/organic substrate at low temperature, with favorable manufacturing efficiency, and in a manner suitable for mass production that was not possible conventionally. The present invention yields an additional effect in that the phosphor film is able to attain superior light emission, and can be applied to a plasma-resistant thin film, a high-K thin film, an infrared sensor device buffer layer, an superconducting device buffer layer and a dielectric device buffer layer.

DETAILED DESCRIPTION

The manufacturing method of a phosphor according to the present invention is characterized in that a metal organic compound solution for forming a phosphor is applied on a support, and a film is irradiated with an ultraviolet beam during the subsequent drying process, calcination process and baking process. A laser beam may be used as the ultraviolet radiation in the present invention.

Depending on the objective, the irradiation process may be performed during a prescribed process, or before or after the respective processes. Further, it is also possible to spin coat the metal organic compound solution on a substrate, dry the substrate for solvent elimination in a thermostatic bath at 130° C., thereafter mount the sample on a sample holder in a laser chamber, and perform laser irradiation at room temperature.

As a result of irradiating laser on a film applied with a metal organic compound and thereafter dried and a film at the initial stage of baking, and thereafter performing appropriate thermal treatment to these laser irradiated films, for instance, the following effects were confirmed in the case of preparing a $Y_2O_3$ film.

After the process of applying and drying a metal organic compound solution for preparing a $Y_2O_3$ film on a substrate, by irradiating ultraviolet radiation (laser, lamp light) during the calcination processing of thermally decomposing the organic constituent in the metal organic compound, it has been discovered that crystallization is promoted at a low temperature.

Figure 1:
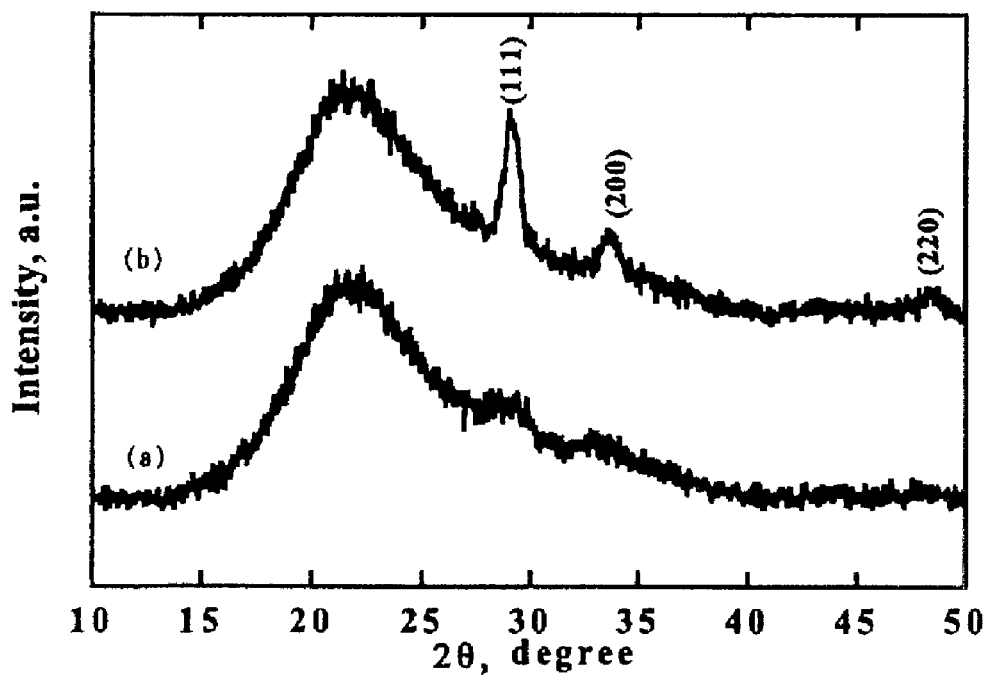
FIG. 1 shows the XRD patterns of films prepared by thermal treatment.

With conventional thermal MOD process, as shown in FIG. 1, it is known that crystallization of the $Y_2O_3$ film will not occur at 500° C., and that the crystallization of the $Y_2O_3$ film is promoted at 750° C. With the manufacturing method of a phosphor film of the present invention, thin film crystal growth has been confirmed at a low temperature.

Figure 2:
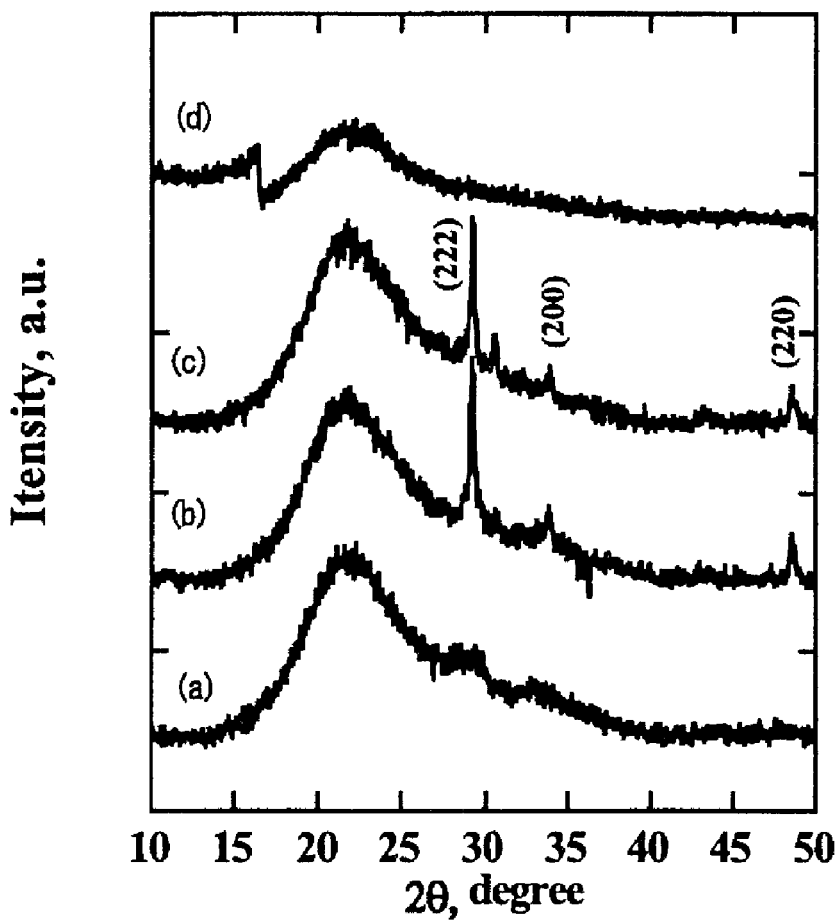
FIG. 2 shows the XRD patterns of films prepared by laser-irradiation film of the present invention.

FIG. 2 shows the XRD patterns of the obtained films prepared by the thermal MOD at 500° C. and the laser-assisted MOD process. In the case of the thermal MOD process at 500° C., a peak due to the $Y_2O_3$ film can hardly be observed. On the other hand, the $Y_2O_3$ film is crystallized by the laser irradiation of an ArF excimer laser at 100 pulses and at 1 Hz with a fluence of 100 $mJ/cm^2$, and it has been discovered that ArF laser irradiation is effective for the crystallization of $Y_2O_3$ film.

Figure 3:
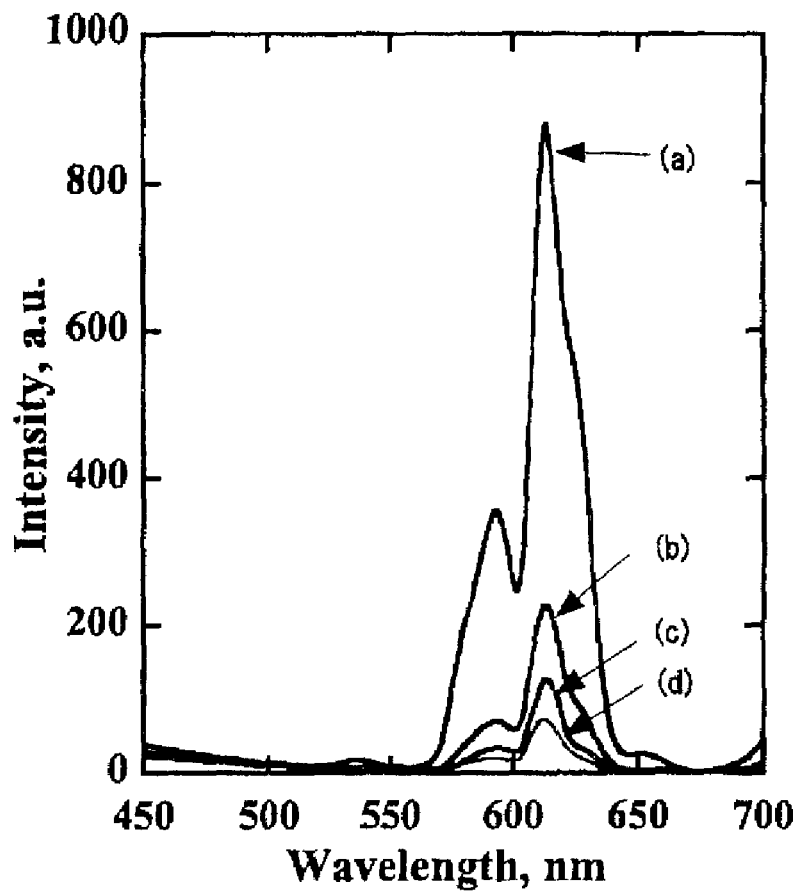
FIG. 3 shows the PL spectra of films prepared by thermal treatment and laser-irradiation.

FIG. 3 shows the measurement results of the photoluminescence of a film prepared by simple thermal MOD process and laser-assisted MOD process. As evident from FIG. 3, the luminescence intensity is the highest when performing laser irradiation in comparison to a case of performing thermal treatment at a high temperature.

Specific examples of the present invention are now explained in detail below, but the present invention is not limited by these examples in any way.

A quartz substrate and a non-alkali glass substrate were used as the substrate for the Examples in the present invention, and a solution obtained by mixing an europium 2-ethylhexanoate solution to an yttrium 2-ethylhexanoate solution was used as the starting material solution. KrF excimer laser, ArF excimer laser, and XeCl excimer laser were used for the irradiation of ultraviolet radiation.

EXAMPLE 1

10 mol % of a europium 2-ethylhexanoate solution was added to a yttrium 2-ethylhexanoate solution to prepare a mixed solution (YI).

The YI solution was spin coated on a quartz substrate at 3000 rpm for 10 seconds, and heated at 400° C. for 10 minutes. Subsequently, the substrate temperature was retained at 400° C. and a film was irradiated with the pulsed laser of 193 nm at 100 pulses and at a reputation rate of 1 Hz in the atmosphere with a fluence of 100 $mJ/cm^2$. The prepared $Y_2O_3$:Eu film having a film thickness of roughly 200 nm showed high luminescence intensity based on ultraviolet excitation only at the irradiated portion.

EXAMPLE 2

When the film was irradiated with ArF laser with a fluence of 150 $mJ/cm^2$ in Example 1, only the irradiated portion showed high luminescence intensity based on ultraviolet excitation.

EXAMPLE 3

When the film was irradiated with ArF laser with a fluence of 200 $mJ/cm^2$ in Example 1, only the irradiated portion showed high luminescence intensity based on ultraviolet excitation.

EXAMPLE 4

When the reputation rate was set to 10 Hz in Example 1, after 10 seconds of laser irradiation, only the irradiated portion showed high luminescence intensity based on ultraviolet excitation.

EXAMPLE 5

When the reputation rate was set to 50 Hz in Example 1, after 2 seconds of laser irradiation, only the irradiated portion showed high luminescence intensity based on ultraviolet excitation.

EXAMPLE 6

When the quartz substrate was replaced with an ITO/glass substrate (ITO coated on a glass substrate) in Example 1, a crystallized $Y_2O_3$ film was obtained at the irradiated portion. Further, only the irradiated part showed high luminescence intensity based on ultraviolet excitation.

EXAMPLE 7

When the quartz substrate was replaced with a non-alkali glass substrate in Example 1, only the irradiated part showed high luminescence intensity based on ultraviolet excitation.

Comparative Example 1

When the wavelength of the laser beam was set to 248 nm in Example 1, crystallization reaction did not occur. Further, the luminescence intensity decreased by a factor of only ¼ in comparison with the irradiated part of the film with the ArF laser as mentioned in Example 1.

Comparative Example 2

When the wavelength of the laser beam was set to 308 nm in Example 1, crystallization reaction did not occur. Further, the luminescence intensity decreased by a factor of only ¼ in comparison with the irradiated part of the film with the ArF laser as mentioned in Example 1.

Comparative Example 3

When laser irradiation was not performed in Example 1, the luminescence intensity decreased by a factor of only ¼ in comparison with the irradiated part of the film with the ArF laser as mentioned in Example 1.

Comparative Example 4

When the heating temperature was set to 200° C. in Example 1, the luminescence intensity decreased by a factor of only ¼ in comparison with the irradiated part of the film with the ArF laser as mentioned in Example 1.

Comparative Example 5

The YI solution was spin coated on a quartz substrate at 3000 rpm for 10 seconds, and heated at 400° C. for 10 minutes. Subsequently, the substrate was heated at 750° C. for 60 minutes. As a result, as shown in the drawings, although the $Y_2O_3$ film was crystallized, the luminescence intensity decreased by a factor of only ¼ in comparison with the irradiated part of the film with the ArF laser as mentioned in Example 1.

Comparative Example 6

The YI solution was spin coated on non-alkali glass at 3000 rpm for 10 seconds, and heated at 400° C. for 10 minutes. As a result, the luminescence intensity decreased by a factor of only ¼ in comparison with the irradiated part of the film with the ArF laser as mentioned in Example 1.

Comparative Example 7

The YI solution was spin coated on an ITO/quartz substrate at 3000 rpm for 10 seconds, and heated at 400° C. for 10 minutes. As a result, the luminescence intensity decreased by a factor of only ¼ in comparison with the irradiated part of the film with the ArF laser as mentioned in Example 1.

EXAMPLE 8

The YI solution was spin coated on quartz at 3000 rpm for 10 seconds, the film was irradiated with ArF laser at 3000 pulses and at a reputation rate of 10 Hz at room temperature with a fluence of 20 mJ/cm$^2$, and thereafter the film was irradiated by ArF laser 100 pulses and at a reputation rate of 1 Hz with a fluence of 100 mJ/cm$^2$. Thereby, a crystalline $Y_2O_3$ film was obtained. Only the irradiated portion of the film emitted light.

EXAMPLE 9

The YI solution was spin coated on an ITO substrate at 3000 rpm for 10 seconds, the film was irradiated with ArF laser at 3000 pulses and 10 Hz at room temperature with a fluence of 20 mJ/cm$^2$, and thereafter the film was irradiated with ArF laser at a reputation rate of 1 Hz for 100 pulses with a fluence of 60 mJ/cm$^2$. Thereby, a crystalline $Y_2O_3$ film was obtained. Only the irradiated part of the film emitted light.

What is claimed is:

1. A manufacturing method of a crystallized metal oxide thin film, comprising:
   a step of retaining an organic metal thin film or a metal oxide film containing at least one rare-earth metal element selected from a group consisting of Y, Dy, Sm, Gd, Ho, Eu, Tm, Tb, Er, Ce, Pr, Yb, La, Nd and Lu formed on a substrate at a temperature of 25 to 600° C.; and
   a step of crystallizing said organic metal thin film or said metal oxide film while irradiating ultraviolet radiation having a wavelength of 200 nm or less;
   said step of irradiating the organic metal thin film or a metal oxide film with ultraviolet radiation occurring after the organic metal thin film or metal oxide film is subject to thermal decomposition calcination.

2. The manufacturing method of a crystallized metal oxide thin film according to claim 1, wherein said organic metal thin film or said metal oxide film is prepared by sputtering, MBE, vacuum deposition, CVD, or a chemical solution deposition method (MOD and spray method).

3. The manufacturing method of a crystallized metal oxide thin film according to claim 1 or claim 2, wherein an organic compound of said metal organic thin film is one selected from β-diketonato, long-chain alkoxide with carbon number 6 or greater, and organic acid salt that may contain halogen.

4. The manufacturing method of a crystallized metal oxide thin film according to claim 1 or claim 2, wherein said ultraviolet radiation is a pulsed laser.

5. The manufacturing method of a crystallized metal oxide thin film according to claim 1 or claim 2, wherein the temperature of said metal organic thin film or said metal oxide film is retained at 350 to 450° C., and is irradiated by an ultraviolet laser.

6. The manufacturing method of a crystallized metal oxide thin film according to claim 1 or claim 2, wherein said metal organic thin film is irradiated at room temperature with an ultraviolet laser having a reputation rate of 10 Hz or greater and a fluence of 30 mJ/cm² or less, and thereafter irradiated with a laser beam having a fluence of 30 mJ/cm² or greater with a plurality of fluences.

7. The manufacturing method of a crystallized metal oxide thin film according to claim 1 or claim 2, wherein said substrate is selected from a group consisting of silicon, compound semiconductor, organic substrate, quartz, non-alkali glass, strontium titanate ($SrTiO_3$), lanthanum aluminate ($LaAlO_3$), magnesium oxide (MgO), lanthanum strontium tantalum aluminum oxide (($La_xSr_{1-x}$)($Al_xTa_{1-x}$)$O_3$), neodymium gallate ($NdGaO_3$), yttrium aluminate ($YAlO_3$) single crystal, aluminum oxide ($Al_2O_3$), yttria-stabilized zirconia (($Zr,Y$)$O_2$, YSZ) and metal substrate.

8. The manufacturing method of a crystallized metal oxide thin film according to claim 7, wherein said substrate has formed thereon a conductive buffer layer containing one or more types selected from $In_2O_3$, $SnO_2$ and ZnO.

9. A method according to claim 1, wherein said organic metal thin film or metal oxide film is selected from the group consisting of $Y_2O_3$, $La_2O_3$, $CeO_2$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

10. A manufacturing method of a crystallized metal oxide thin film, comprising:
   a step of retaining a rare-earth oxide film containing at least one element selected from a group consisting of Y, Dy, Sm, Gd, Ho, Eu, Tm, Tb, Er, Ce, Pr, Yb, La, Nd and Lu formed on a substrate at a temperature of 25 to 600° C.; and
   a step of crystallizing said rare-earth oxide film while irradiating ultraviolet radiation having a wavelength of 200 nm or less;
   said irradiating during said crystallizing step including irradiating said film at room temperature with an ultraviolet laser having a reputation rate of 10 Hz or greater and a fluence of 30 mJ/cm² or less, and thereafter irradiating with a laser beam having a fluence of 30 mJ/cm² or greater with a plurality of fluencies; and
   said step of irradiating the rare earth oxide film with ultraviolet radiation occurs after the rare earth oxide film is subject to thermal decomposition calcination.

11. A manufacturing method according to claim 10, wherein said substrate is selected from a group consisting of silicon, compound semiconductor, organic substrate, quartz, non-alkali glass, strontium titanate ($SrTiO_3$), lanthanum aluminate ($LaAlO_3$), magnesium oxide (MgO), lanthanum strontium tantalum aluminum oxide (($La_xSr_{1-x}$)($Al_xTa_{1-x}$)$O_3$), neodymium gallate ($NdGaO_3$), yttrium aluminate ($YAlO_3$) single crystal, aluminum oxide ($Al_2O_3$), yttria-stabilized zirconia (($Zr,Y$)$O_2$, YSZ) and metal substrate; and wherein said substrate has formed thereon a conductive buffer layer containing one or more of $In_2O_3$, $SnO_2$ and ZnO.

12. A method according to claim 10, wherein said rare earth oxide film is selected from the group consisting of $Y_2O_3$, $La_2O_3$, $CeO_2$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

* * * * *